(12) United States Patent
Umali et al.

(10) Patent No.: US 10,396,111 B2
(45) Date of Patent: Aug. 27, 2019

(54) PACKAGE FOR AN OPTICAL SENSOR, OPTICAL SENSOR ARRANGEMENT AND METHOD OF PRODUCING A PACKAGE FOR AN OPTICAL SENSOR

(71) Applicant: ams AG, Unterpremstaetten (AT)

(72) Inventors: Arnold Umali, Calamba (PH); Harald Etschmaier, Mautern (AT); Guenter Aflenzer, Unterpremstaetten (AT)

(73) Assignee: ams AG, Unterpremstaetten (AT)

( * ) Notice: Subject to any disclaimer, the term of this patent is extended or adjusted under 35 U.S.C. 154(b) by 0 days.

(21) Appl. No.: 14/906,263

(22) PCT Filed: Jun. 25, 2014

(86) PCT No.: PCT/EP2014/063413
§ 371 (c)(1),
(2) Date: Jan. 19, 2016

(87) PCT Pub. No.: WO2015/007485
PCT Pub. Date: Jan. 22, 2015

(65) Prior Publication Data
US 2016/0163750 A1    Jun. 9, 2016

(30) Foreign Application Priority Data

Jul. 19, 2013  (EP) .................................... 13177174
Nov. 28, 2013  (EP) .................................... 13194925

(51) Int. Cl.
*H01L 23/29* (2006.01)
*H01L 23/552* (2006.01)
*H01L 27/146* (2006.01)

(52) U.S. Cl.
CPC ...... *H01L 27/14618* (2013.01); *H01L 23/293* (2013.01); *H01L 23/552* (2013.01);
(Continued)

(58) Field of Classification Search
CPC ............... H01L 25/167; H01L 23/3107; H01L 27/14618; H01L 23/293; H01L 23/552;
(Continued)

(56) References Cited

U.S. PATENT DOCUMENTS 6,294,313 B1* 9/2001 Kobayashi ....... B29D 11/00365
  101/453
6,384,473 B1* 5/2002 Peterson ............... B81B 7/0067
  257/680

(Continued)

FOREIGN PATENT DOCUMENTS

EP   0014373 A1   8/1980
EP   1608026 A2   12/2005
(Continued)

OTHER PUBLICATIONS

Simpson & Weiner, "The Oxford English Dictionary", 1989, Oxford: Clarendon Press, V 20.*

*Primary Examiner* — Didarul A Mazumder
*Assistant Examiner* — Patricia D Reddington
(74) *Attorney, Agent, or Firm* — Fish & Richardson P.C.

(57) ABSTRACT

A package for an optical sensor, comprises an optically opaque enclosure for forming a cavity when mounted onto a substrate and an optical element based on an optically translucent polymer. An aperture in the enclosure is designed to attach the optical element to the enclosure.

19 Claims, 2 Drawing Sheets

(52) U.S. Cl.
CPC .. *H01L 27/14621* (2013.01); *H01L 27/14625* (2013.01); *H01L 27/14636* (2013.01); *H01L 27/14685* (2013.01); *H01L 27/14627* (2013.01); *H01L 2224/48091* (2013.01); *H01L 2224/48137* (2013.01); *H01L 2224/48227* (2013.01); *H01L 2224/73265* (2013.01); *H01L 2924/00* (2013.01)

(58) Field of Classification Search
CPC ......... H01L 27/14621; H01L 27/14625; H01L 27/14636; H01L 27/14685; H01L 27/14627; H01L 2224/48091; H01L 2224/48137
USPC .......................................................... 257/432
See application file for complete search history.

(56) References Cited

U.S. PATENT DOCUMENTS

| | | | | |
|---|---|---|---|---|
| 6,674,159 | B1* | 1/2004 | Peterson | B81B 7/0067 257/431 |
| 8,097,852 | B2 | 1/2012 | Yao | |
| 8,362,496 | B1* | 1/2013 | Tu | H01L 25/167 257/80 |
| 8,378,442 | B2 | 2/2013 | Fuke | |
| 8,804,255 | B2* | 8/2014 | Duparre | B29D 11/00298 359/621 |
| 9,804,367 | B2* | 10/2017 | Wan | G02B 13/0085 |
| 2008/0237764 | A1* | 10/2008 | Kikuchi | H01L 27/1462 257/432 |
| 2009/0278219 | A1 | 11/2009 | Morrison | |
| 2010/0123209 | A1* | 5/2010 | Duparre | B29D 11/00009 257/432 |
| 2010/0177411 | A1* | 7/2010 | Hegde | G02B 7/08 359/823 |
| 2010/0224949 | A1* | 9/2010 | Fuke | C08K 5/0008 257/433 |
| 2011/0057012 | A1* | 3/2011 | Yamamoto | A61F 13/15609 226/1 |
| 2011/0057102 | A1* | 3/2011 | Yao | G01S 7/4813 250/338.1 |
| 2012/0140340 | A1* | 6/2012 | Duparre | B29D 11/00375 359/811 |
| 2014/0158889 | A1* | 6/2014 | Ruh | G01J 5/02 250/353 |
| 2014/0329325 | A1* | 11/2014 | Fozdar | C12N 13/00 435/440 |

FOREIGN PATENT DOCUMENTS

| | | |
|---|---|---|
| EP | 1903605 A1 | 3/2008 |
| EP | 2228407 A1 | 9/2010 |
| GB | 2107112 A | 4/1983 |
| WO | 2004/086515 A1 | 10/2004 |
| WO | 2004/113887 A2 | 12/2004 |
| WO | 2009/076789 A1 | 6/2009 |
| WO | 2009/158414 A1 | 12/2009 |
| WO | 2013/010285 A1 | 1/2013 |

* cited by examiner

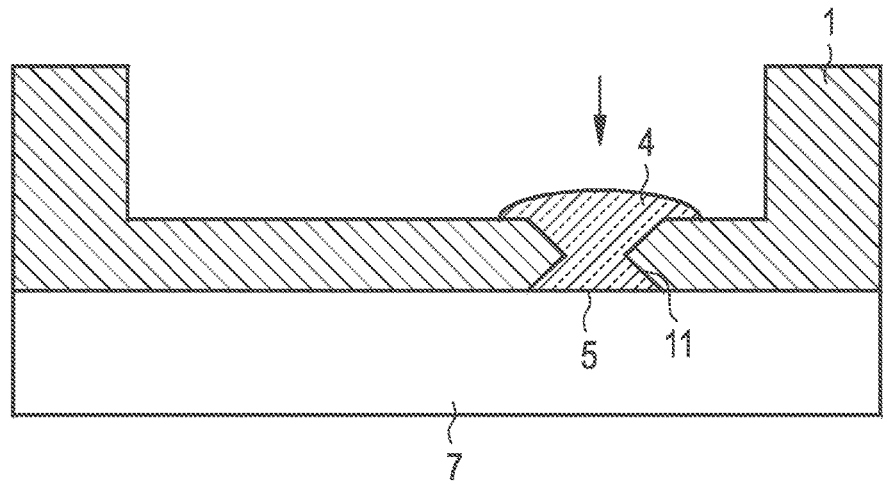
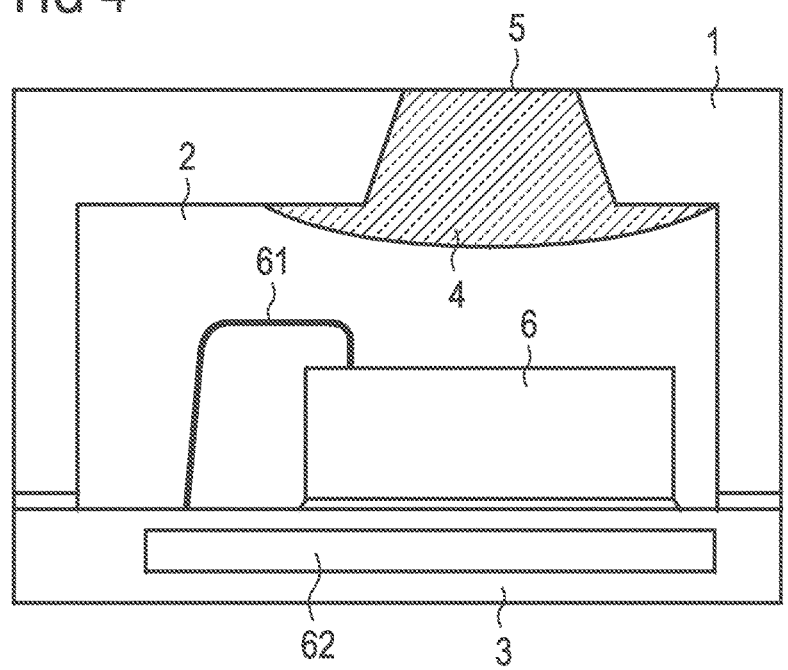

PACKAGE FOR AN OPTICAL SENSOR, OPTICAL SENSOR ARRANGEMENT AND METHOD OF PRODUCING A PACKAGE FOR AN OPTICAL SENSOR

This disclosure relates to a package for an optical sensor, an optical sensor arrangement and a method of producing a package for an optical sensor.

BACKGROUND OF THE INVENTION

Mobile devices such as cellular telephones, smart phones, and other handheld or portable electronic devices such as personal digital assistants (PDA), headsets, MP3 players, and the like have become popular and ubiquitous. As more and more features have been added to mobile devices, there has been an increasing need to equip these mobile devices with input mechanisms that accommodate numerous user commands and react to numerous user behaviors. For example, many mobile devices are now equipped not only with buttons, but also with capacitive touch screens by which a user, simply by touching the surface of the device, is able to communicate a variety of messages or instructions.

It is of increasing interest that mobile devices are capable of detecting the presence of, and determining with some accuracy the position of, physical objects located outside of the mobile devices and, more particularly, the presence and location of people who are using the mobile devices or otherwise are located nearby the mobile devices. By virtue of such capabilities, the mobile devices are able to adjust their behavior in a variety of manners that are appropriate given the presence and location of people or other physical objects.

Recently remote sensing devices such as infrared or near-infrared transceivers have are employed in some mobile devices to allow for the detection of people or objects even when not in physical contact with the mobile devices.

Generally, these devices require a package that provides not only protection from environmental influences such as heat, pressure or moisture, but also optical functionality. The wavelength of the radiation that reaches the sensor often needs to be restricted to the near-infrared. This requires an optical filter which is integrated in the assembly. This puts high demands on optical packaging technology, more particularly to a low cost optical cavity package with filter functionality.

Prior art has come up with compositions of epoxy resins for semiconductor integrated circuit encapsulation. Some solutions suggest a combination of an optical receiving element with an optical filter consisting of a plurality of laminated light transmission layers deposited on the surface of a color glass filter or consisting of a crystal. Few approaches describe optical module packages consisting of an opaque cavity and a clear mold encapsulation. For these cases the mold compound is in contact with the sensor and thus cannot be used applications in which the sensor surface needs to be isolated from its surroundings.

SUMMARY OF THE INVENTION

A package for an optical sensor comprises an optically opaque enclosure, an optical element, and an aperture in the enclosure. The aperture in the enclosure is designed to attach the optical element to the enclosure. The optical element is made from, or based on, an optically translucent polymer. The optically opaque enclosure forms a cavity in combination with a substrate when mounted onto the substrate. Thus, the package can be used to create an optical sensor arrangement with the optical sensor placed inside the cavity. A formulation of the polymer is adapted to achieve filter properties, in particular to achieve specific desired filter properties, of the optical element.

The term "optical" refers the range of visible, ultraviolet, and infrared light. The term "opaque" is used to define the optical properties of the enclosure. Essentially, this means the enclosure is made from a material that is blocking all of the incident light, i.e. visible, ultraviolet and infrared light. Consequently, the only way to enter light into the optical sensor package is by means of the aperture in the enclosure. The cavity constructed by means of the enclosure is sealed by means of the optical element. It is evident to the skilled reader, that said translucence of the polymer depends on the sensitivity spectrum of the optical sensor. That is the polymer is translucent for example for light within the sensitivity spectrum of the optical sensor.

The optical element has optical properties and may comprise a lens, a filter or a window made from a polymer material and integrated into the enclosure. The term "translucent" denotes that light is able to pass the aperture through the optical element so light is allowed to pass through the material. However, the light does not necessarily have to follow Snell's law.

After fabrication of the package for an optical sensor the aperture attaches or connects the optical element to the enclosure. This can be achieved by employing a special geometry of the aperture. However, with proper choice of the optically translucent polymer the optical element inherently sticks to the aperture, for example.

The package offers the possibility of have an optical element in the path of light while keeping the sensor element isolated from the surroundings. This can improve the performance of the device or even be necessary for a proper function. Compared to conventional glass-based or crystal-based optical elements, polymer-based optical elements are cheaper and easier to apply. There is no need for additional glue to keep the element in place. The polymer has optical properties and may act as a lens, a filter and/or optical window at the same time, depending on mold shape and formulation of the polymer.

Compared to conventional glass or crystal based optical elements, polymer based optical elements are cheaper and easier to apply. There is no need for additional glue to keep the element in place. The polymer has optical properties and may act as a lens, a filter and/ or optical window at the same time depending on mold shape and formulation of the polymer.

In an embodiment of the package, the optical element comprises an optically transparent polymer. In a transparent polymer the light entering the package via the optical element follows Snell's law of refraction and, thus, could alter an incoming ray of light. In this case, an optical sensor could be able to reproduce the optical image of an object to be detected or the optical element diverts or collects the incident light.

In an embodiment of the package, the optical element is a lens. When implemented the optical element as a lens it has optical properties. For example, the lens can be used to focus or direct the incident light onto certain regions of the optical sensor.

In an embodiment of the package, the optically translucent or transparent polymer and, thus, the optical element has optical filter properties. This can be in addition, or as an alternative to the above-described lens properties of the optical element. In this case, incident light can be filtered according to a characteristic transmission spectrum of the optical translucent/transparent polymer used to make the optical element. It is then possible to use the package for constructing a color sensor or to use the sensor arrangement in spectroscopic applications.

In another embodiment of the package, the polymer comprises a resin, in particular a functional resin, in particular an epoxy resin. Epoxy resins, or generally resins, have the advantage of being viscous liquids that are capable of hardening permanently. Typically they can be solved in the polymer. Therefore, resins can be used during the fabrication of the package or, in more detail, the fabrication of the optical element in a liquid phase. By means of a hardening process, for example by application of ultraviolet light or drying, the resin hardens and the optical element becomes solid. At the same time, a resin can provide the connection to the aperture as the resins act like a glue and sticks to a wall of the aperture.

In another embodiment of the package the epoxy resin composition comprises the epoxy resin, a curing agent and a colorant. The curing agent can also be supplemented with a curing accelerator. The curing agent is used to promote the toughening or hardening of the optically translucent or transparent polymer material by cross-linking of polymer chains. Toughening or hardening can be brought about by chemical additives, ultraviolet radiation, electron beam or heat. The curing accelerator can be used to accelerate the processes. The colorant is used to adjust the color of the optical element. This can be for design purpose. For example, the colorant is used to define filter properties if the optical element is to be used as a filter for incident light.

In another embodiment of the package the colorant comprises a dye, a pigment, a nanoparticle, an ink, a paint, a colored chemical or food coloring or a combination thereof.

In some embodiments the colorant is used to define the filter properties of the optical element.

In an embodiment of the package the aperture has a geometric shape designed to attach the optical element to the enclosure. In particular, the aperture has a conical shape or a chevron shape. In some case, e.g. when using an epoxy resin, the optically translucent or transparent polymer attaches to the enclosure without the need of additional glue or the like. However, the shape of the aperture can further promote the attachment. In general, the shape is designed to act as a dam for the polymer compound and, thereby also improves the adhesion of the polymer to the enclosure.

In an embodiment of the package the enclosure comprises an electromagnetic shield layer. In particular, the enclosure comprises a metal layer and/or conductive polymer layer. Typically, the sensitive electrical components in an optical sensor arrangement need to be protected from electromagnetic interference. The electromagnetic shield layer makes use of the Faraday effect and effectively shields any components within the cavity formed by the enclosure. The electromagnetic shield layer can be produced by sputtering the metal layer onto a surface of the enclosure which faces towards the optical sensor, denoted inner side hereinafter. Generally, the electromagnetic shield layer covers the entire inner side but it I possible to have only parts covered. In an alternative, or additionally, the enclosure can be made of the conductive polymer which conducts electricity.

An optical sensor arrangement according to the present principle comprises a substrate, an optical sensor, and the package described above. The substrate is designed for providing electrical connections to at least one terminal. The optical sensor is electrically connected to the substrate. The package is mounted to the substrate and thereby forms the cavity enclosing the optical sensor as already discussed above.

In an embodiment of the optical sensor arrangement the optical sensor comprises an infrared sensor. The infrared sensor is essentially sensitive to infrared light and, more particularly, sensitive to near infrared light.

According to an embodiment of the optical sensor arrangement, the optical sensor is mounted to the substrate and electrically connected to the substrate via bond wires. In an alternative, however, the optical sensor is integrated into the substrate. Electrical connections are then established by the substrate.

A method of producing a package for an optical sensor according to the present principle comprises the step of providing an optically opaque enclosure with an aperture. The enclosure is then placed onto an auxiliary substrate to seal the aperture. Then, an optical element is formed by applying an optically translucent polymer or, alternatively, an optically transparent polymer, within the aperture. Therein, a formulation of the polymer is adapted to achieve specific optical filter properties of the optical element.

For example, the polymer is applied to the aperture in liquid phase. The auxiliary substrate prevents the liquid polymer from dropping out and, thus, acts as a mold. The polymer can then be toughened or hardened by means of drying, chemical additives, ultraviolet radiation, electron beam or heat. The resulting optical element is solid and attached or adhered to the enclosure by means of the aperture, i.e. without the need for glue or the like.

A package or cavity package for an optical sensor produced according to the presented method offers the possibility of having an optical element in the path of light while keeping a sensor element isolated from its surroundings. This can improve the performance of the device or even be necessary for a proper function. Compared to conventional glass or crystal based optical elements, polymer based optical elements are cheaper and easier to apply. There is no need for additional glue to keep the element in place. The polymer has optical properties and may act as a lens, a filter and/ or optical window at the same time depending on mold shape and formulation of the polymer.

In an embodiment of the method the auxiliary substrate is provided with a recess which can be placed opposite to the aperture. The recess forms the optical element, i.e. an optical lens, optical window and/or optical filter. For example, if the recess as convex shape, the resulting lens is concave and vice versa. In other words, the shape of the recess defines the optical properties of the optical element, in particular, lens shape.

In an embodiment of the method the polymer gets cured by means of mold curing and thereby forms the optical element.

The curing is used to promote the toughening or hardening of the optically translucent or transparent polymer material by cross-linking of polymer chains. Toughening or hardening can be brought about by chemical additives, ultraviolet radiation, electron beam or heat.

BRIEF DESCRIPTION OF THE DRAWINGS

In the following, the principle presented above will be described in more detail with respect to drawings in which exemplary embodiments are presented.

FIG. 3 shows an embodiment of a package for an optical sensor and

FIG. 4 shows an embodiment of a package for an optical sensor.

DETAILED DESCRIPTION

Figure 1:
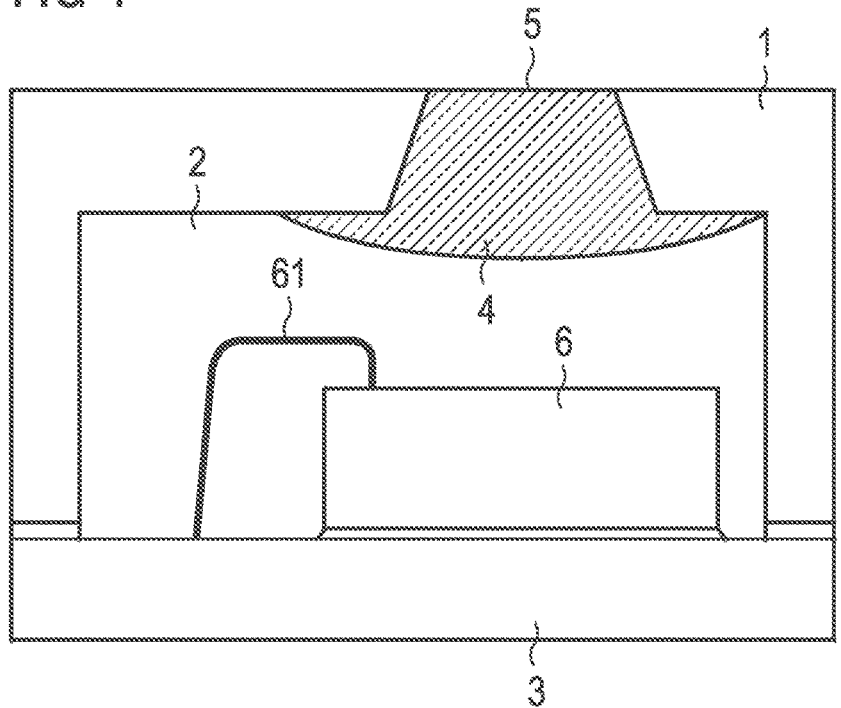
FIG. 1 shows an embodiment of an optical sensor arrangement.

FIG. 1 shows an embodiment of an optical sensor arrangement. The cavity package 1 encloses an optical sensor 6, for example an infrared (IR) sensor, and is mounted onto a printed board (PCB) substrate which provides the electrical connections to pads, e.g. via package leads on the bottom side. The optical sensor 6 is electrically connected to the substrate 3 via bond wires 61 or the like. In an alternative, not shown, the electrical connections can be realized through the substrate, e.g. via through-silicon vias. Via the substrate 3 the optical sensor 6 is electrically connected to further components which promote operation of the device, e.g. connected to an integrated circuit (not shown).

The optical sensor 6 is enclosed by an opaque (e.g. plastic or polymer) enclosure 1 having an aperture 5 in which an optical element 4 is attached. The optical element 4 is filled with an optically transparent polymer or polymer compound. The aperture 5 in this embodiment has conical shape, for example. The enclosure 1 ensures protection from the environment as its opaque material absorbs light and seals the cavity. The material is opague with respect to infared, visible, and ultraviolet light.

Figure 2:
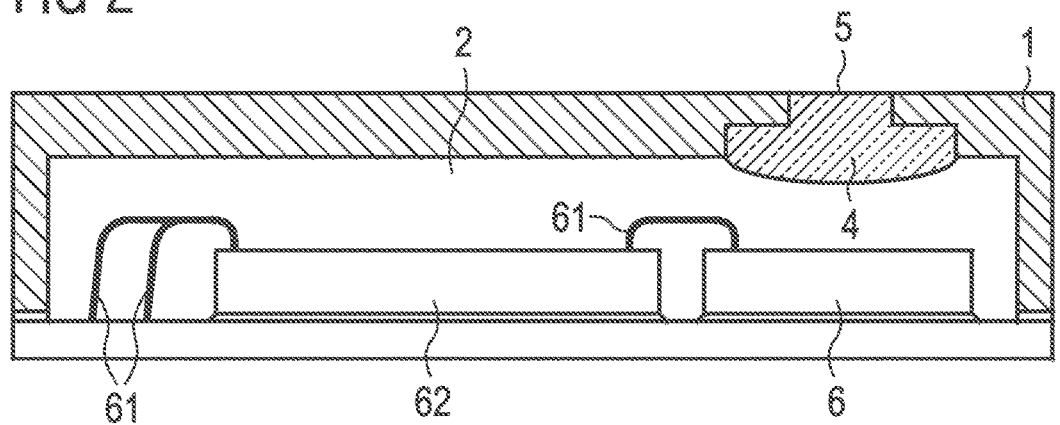
FIG. 2 shows another embodiment of an optical sensor arrangement.

FIG. 2 shows another embodiment of an optical sensor arrangement. The optical sensor 6 is mounted onto the substrate 3 which provides the electrical connections to the pads (not shown). The optical sensor 6 is enclosed by an opaque enclosure 1 with an aperture 5 that is filled with the optically transparent polymer or polymer compound constituing the optical element 4. The aperture 5 is designed in such a way that it acts as a dam for the polymer or compound and provides adhesion of the polymer or compound to the opaque enclosure 1 due to greater adhesion surface. In this case the aperture 5 has cascaded shape. Besides the optical sensor 6 also one or more integrated circuits 62 could be mounted on top or within the substrate 3 and may hold control and signal processing components. Electrical interconnections are established by means of bond wires 61 or similar connections.

FIG. 3 shows an embodiment of a package for an optical sensor. The enclosure 1 is placed on an auxiliary substrate 7 with low wettability, e.g. Teflon, to prevent it from sticking to the polymer compound. The aperture 5 in the enclosure 1 is then filled from the top (indicated with an arrow in the drawing) with the (functional) polymer or polymer compound. By changing the shape of the auxiliary substrate 7 the optical element can can be formed, e.g. by providing a recess in the auxiliary substrate having a lens shape in order to fabricate a lens. Alternatively, a stamp can be used to impress the lens shape into the polymer. A chevron feature in a sidewall 11 of the aperture 5 locks the polymer compound into place. Finally, the polymer or polymer compound gets cured by means of mold curing thereby forming the optical element.

The polymer or polymer compound comprises a functional resin or an epoxy resin. Furthermore, the composition of the epoxy resin comprises the epoxy resin itself, a curing agent, and a colorant. Additionally, the composition can also have a curing accelerator. Generally, the polymer or polymer compound is liquid at the moment of application to the aperture 5.

In more detail, the colorant comprises a dye, a pigment, an ink, nano-particles, a paint, a colored chemical or food coloring or a combination thereof. Due to the optical properties of the polymer or polymers in the compound the resulting optical element has optical properties. These include translucency and/or transparency so that light and/ infrared light can enter the aperture and be detected by the optical sensor. But also filter properties can be achieved as polymers have characteristic spectra, like absorption spectra. Filter properties of the compound can also be achieved by choosing the colorant to have a desired transmission spectrum. These can be further fine-tuned by choice of several different colorants.

FIG. 4 shows another embodiment of an optical sensor arrangement. The embodiment depicted in the drawing is based on the one presented in FIG. 1. It differs from the embodiment already described in that the integrated circuit 62 is embedded into the substrate 3. The substrate 3 comprises an opaque printed circuit board (PCB) laminate substrate with electrical connections 61 to the optical sensor 6 and further components. Common embedding technology is applied to this packaging concept to further reduce its footprint. One way to achieve such embedded integration is by using a chipletT fabrication sequence. Generally, the printed circuit board with the embedded, integrated circuit 62 is comprised by a layer stack of several single layers which enclose the integrated circuit 62. The stacking-up is then followed by an alignment and tracking process. The so achieved layer stack-up is then laminated under pressure and heat and the resulting device is then, in a backend process, bumped, marked and singulated. Embedding the integrated circuit 62 is advantageous in highly integrated devices.

The invention claimed is:

1. A package for an optical sensor, comprising:
an optically opaque enclosure to be mounted onto a substrate;
an optical element; and
an aperture in the enclosure,
wherein
the enclosure forms a cavity in combination with the substrate,
the optical element comprises an optically translucent polymer,
the formulation of the polymer achieves optical filter properties of the optical element,
the aperture attaches the optical element to the enclosure,
the polymer comprises an epoxy resin,
an epoxy resin composition comprises the epoxy resin, a curing agent, and a colorant, the colorant comprising a dye, a pigment, a nano-particle, an ink, a paint, a colored chemical or food coloring or a combination thereof,
the aperture has a conical geometric shape to attach the optical element to the enclosure,
the optical element is arranged at an underside of the enclosure, the underside facing towards the substrate, and the optical element has conical shape and points towards the substrate,
the enclosure comprises a top layer and two side layers, and
the optical element is inside of and extends beyond an inside surface of the top layer of the enclosure, the enclosure comprises an opaque material, the enclosure and the opaque material sealing the cavity,
the substrate having a low wettability configured for reduced sticking to the polymer.

2. The package for an optical sensor according to claim 1, wherein the optical element is a lens.

3. The package for an optical sensor according to claim 1, wherein the epoxy resin composition further comprises a curing accelerator.

4. The package for an optical sensor according to claim 1, wherein the colorant is used to define the filter properties of the optical element.

5. The package for an optical sensor according to claim 1, wherein the polymer provides a connection to the aperture by sticking to a wall of the aperture.

6. The package for an optical sensor according to claim 1, wherein the enclosure comprises an electromagnetic shield layer, wherein the electromagnetic shield layer comprises at least one of a metal layer or conductive polymer layer.

7. An optical sensor arrangement, comprising:
a substrate for providing electrical connections to at least one terminal;
an optical sensor electrically connected to the substrate; and
the package according to claim 1 mounted to the substrate thereby forming the cavity enclosing the optical sensor.

8. The optical sensor arrangement according to claim 7, wherein the optical sensor comprises an infrared sensor.

9. The optical sensor arrangement according to claim 7, wherein the optical sensor is mounted to the substrate and electrically connected to the substrate via bond wires.

10. The optical sensor arrangement according to claim 7, wherein the optical sensor is integrated into the substrate.

11. The package for an optical sensor according to claim 1, wherein the aperture has a sidewall with a chevron feature and the chevron feature is designed to attach the optical element to the enclosure and the chevron feature locks the polymer into place.

12. The package for an optical sensor according to claim 1, wherein the optical element is arranged at least partially in the aperture and fills the aperture.

13. The package for an optical sensor according to claim 1, wherein at least part of the optical element covers a portion of the inside surface of the top layer.

14. The package for an optical sensor according to claim 1, wherein the enclosure including the optical element is fabricated before it is mounted onto the substrate, and wherein after the polymer is applied as liquid to form the optical element in the enclosure, the substrate is removed.

15. The package for an optical sensor according to claim 1, wherein the aperture widens from an upper side of the enclosure to the underside of the enclosure.

16. A method of producing a package for an optical sensor, comprising the steps of:
providing an optically opaque enclosure with an aperture;
placing the enclosure onto an auxiliary substrate to seal the aperture; and
forming an optical element by applying an optically translucent polymer or optically transparent polymer within the aperture, wherein the formulation of the polymer achieves specific optical filter properties of the optical element; and
removing the substrate after forming the optical element from the polymer,
wherein
the polymer comprises an epoxy resin,
an epoxy resin composition comprises the epoxy resin, a curing agent, and a colorant, the colorant comprising a dye, a pigment, a nano-particle, an ink, a paint, a colored chemical or food coloring or a combination thereof,
the aperture has a conical geometric shape to attach the optical element to the enclosure,
the optical element is arranged at an underside of the enclosure, the underside faces towards the substrate once the enclosure is mounted onto the substrate, and the optical element has conical shape and points towards the substrate,
the enclosure comprises a top layer and two side layers, and
the optical element is inside of and extends beyond an inside surface of the top layer of the enclosure,
the enclosure comprises an opaque material, the enclosure and the opaque material sealing the cavity,
the substrate has a low wettability configured for reduced sticking to the polymer,
the optical element is formed by filling the aperture from the top with the polymer, which is liquid during the filling.

17. The method according to claim 16, wherein the polymer is cured by mold curing to form the optical element.

18. The method according to claim 16, further comprising:
providing the substrate with a recess which can be placed opposite to the aperture such that by forming the optical element an optical lens, optical window and/or optical filter is formed.

19. The method according to claim 16, wherein the enclosure including the optical element is fabricated before it is mounted onto the substrate, and wherein after the polymer is applied as liquid to form the optical element in the enclosure, the substrate is removed.

* * * * *